(12) United States Patent
Kobayashi

(10) Patent No.: US 11,843,888 B2
(45) Date of Patent: Dec. 12, 2023

(54) PHOTOELECTRIC CONVERSION DEVICE

(71) Applicant: CANON KABUSHIKI KAISHA, Tokyo (JP)

(72) Inventor: Daisuke Kobayashi, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 72 days.

(21) Appl. No.: 17/588,002

(22) Filed: Jan. 28, 2022

(65) Prior Publication Data
US 2022/0247956 A1 Aug. 4, 2022

(30) Foreign Application Priority Data

Feb. 4, 2021 (JP) .................. 2021-016618

(51) Int. Cl.
H04N 25/75 (2023.01)
H01L 27/146 (2006.01)

(52) U.S. Cl.
CPC ....... *H04N 25/75* (2023.01); *H01L 27/14603* (2013.01)

(58) Field of Classification Search
CPC .......................... H04N 25/75; H01L 27/14603
See application file for complete search history.

(56) References Cited

U.S. PATENT DOCUMENTS

| | | | | |
|---|---|---|---|---|
| 11,528,438 B2* | 12/2022 | Kobayashi | ............ | H04N 25/75 |
| 2004/0041080 A1* | 3/2004 | Barna | ............ | H04N 25/75 |
| | | | | 250/214 R |
| 2018/0234649 A1* | 8/2018 | Matsuura | ............ | H04N 25/67 |
| 2021/0160443 A1* | 5/2021 | Okada | ............ | H04N 25/63 |
| 2021/0281784 A1 | 9/2021 | Okada et al. | | |

FOREIGN PATENT DOCUMENTS

| | | |
|---|---|---|
| JP | 2020014110 A | 1/2020 |
| JP | 2020191543 A | 11/2020 |
| WO | 2019069614 A1 | 4/2019 |

* cited by examiner

*Primary Examiner* — Lin Ye
*Assistant Examiner* — Chriss S Yoder, III
(74) *Attorney, Agent, or Firm* — CANON U.S.A., INC. IP Division

(57) ABSTRACT

Provided is a photoelectric conversion device including: a pixel array including a plurality of pixels arranged to form a plurality of columns; and a column circuit arranged corresponding to each of the plurality of columns of the pixel array. The column circuit includes a sample and hold unit and a plurality of lines including a line configured to supply a potential to the sample and hold unit. The plurality of lines is commonly connected or separated in the photoelectric conversion device.

13 Claims, 16 Drawing Sheets

PHOTOELECTRIC CONVERSION DEVICE

BACKGROUND

Field of the Disclosure

The aspect of the embodiments relates to a photoelectric conversion device.

Description of the Related Art

International Publication No. WO2019/069614 discloses a solid-state imaging element including a sample and hold unit that holds a signal output from a pixel.

In the photoelectric conversion device described in International Publication No. WO2019/069614, further improvement in accuracy is required.

SUMMARY OF THE DISCLOSURE

According to an aspect of the embodiments, there is provided a photoelectric conversion device including: a pixel array including a plurality of pixels arranged to form a plurality of columns and each configured to generate a first signal based on incident light and a second signal based on a reset state; and a column circuit arranged corresponding to each of the plurality of columns of the pixel array. The column circuit includes: a first sample and hold unit configured to hold the first signal; a second sample and hold unit configured to hold the second signal; a delta-sigma analog-to-digital conversion circuit configured to convert an analog signal based on outputs from the first sample and hold unit and the second sample and hold unit into a digital signal; a first line configured to supply a driving potential to the first sample and hold unit; and a second line configured to supply a driving potential to the second sample and hold unit. The first line and the second line are commonly connected in the photoelectric conversion device.

According to another aspect of the embodiments, there is provided a photoelectric conversion device including: a pixel array including a plurality of pixels arranged to form a plurality of columns and each configured to generate a first signal based on incident light and a second signal based on a reset state; and a column circuit arranged corresponding to each of the plurality of columns of the pixel array. The column circuit includes: a first sample and hold unit including a first amplifier and a first source follower circuit that are cascade-connected and configured to hold the first signal; a second sample and hold unit including a second amplifier and a second source follower circuit that are cascade-connected and configured to hold the second signal; a first line configured to supply a driving potential to at least one of the first amplifier and the first source follower circuit; and a second line configured to supply a potential to at least one of the second amplifier and the second source follower circuit. The first line and the second line are commonly connected in the photoelectric conversion device.

According to another aspect of the embodiments, there is provided a photoelectric conversion device including: a pixel array including a plurality of pixels arranged to form a plurality of columns; and a column circuit arranged corresponding to each of the plurality of columns of the pixel array. The column circuit includes: a first sample and hold unit including a first amplifier and a first source follower circuit that are cascade-connected and configured to hold a signal output from a pixel in a corresponding column; an analog-to-digital conversion circuit configured to convert an analog signal based on the signal into a digital signal; a first line configured to supply a driving potential to at least one of the first amplifier and the first source follower circuit; and a third line configured to supply a driving potential to a part of the analog-to-digital conversion circuit. The first line and the third line are separated from each other in the photoelectric conversion device.

Further features of the disclosure will become apparent from the following description of exemplary embodiments with reference to the attached drawings.

DESCRIPTION OF THE EMBODIMENTS

Figure 1:
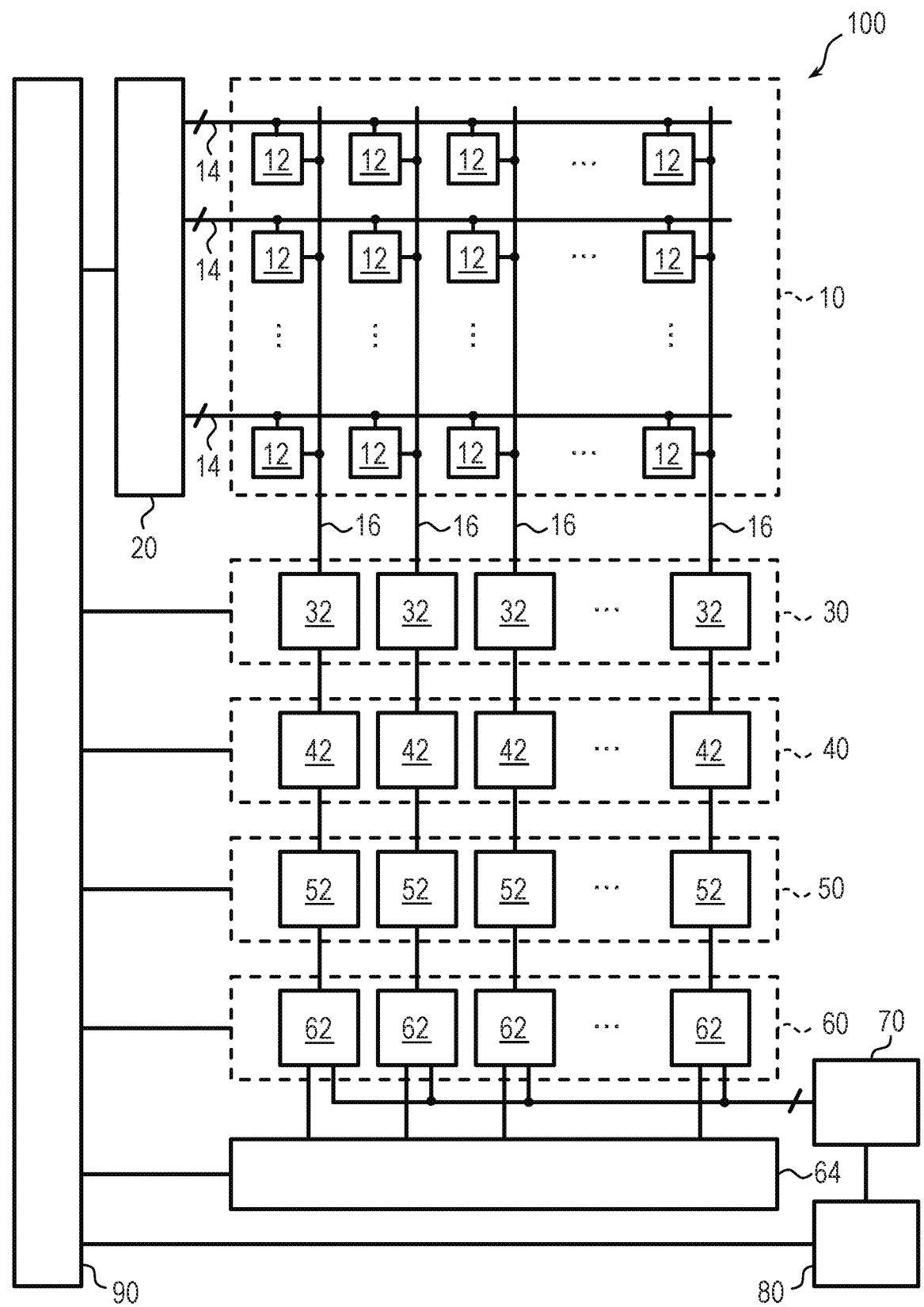
FIG. 1 is a block diagram illustrating a schematic configuration of a photoelectric conversion device according to a first embodiment.

Exemplary embodiments of the disclosure will now be described in detail in accordance with the accompanying drawings. In the drawings, the same or corresponding elements are denoted by the same reference numerals, and the description thereof may be omitted or simplified.

First Embodiment

FIG. 1 is a block diagram illustrating a schematic configuration of a photoelectric conversion device 100 according to the present embodiment. The photoelectric conversion device 100 includes a pixel array 10, a vertical scanning circuit 20, a load circuit unit 30, a signal holding unit 40, an analog-to-digital conversion unit (AD conversion unit) 50, a digital memory unit 60, a horizontal scanning circuit 64, a digital signal processing unit 70, an output unit 80, and a control circuit 90. These circuits may be formed in one or more semiconductor substrates. Note that the photoelectric conversion device 100 of the present embodiment is assumed to be an imaging device for acquiring an image, but the photoelectric conversion device is not limited to this. For example, the photoelectric conversion device may be a focus detection device, a distance measuring device, a time-of-flight (TOF) camera, or the like.

The pixel array 10 includes a plurality of pixels 12 arranged in a plurality of rows and a plurality of columns. The vertical scanning circuit 20 is a scanning circuit that supplies control signals for controlling transistors included in the pixels 12 to be turned on (conductive state) or off (nonconductive state) via control signal lines 14 provided in each row of the pixels 12. The vertical scanning circuit 20 may include a shift register or an address decoder. Here, since the control signals supplied to each pixel 12 may include a plurality of types of control signals, the control signal lines 14 in each row may be configured as a set of a plurality of driving lines. A column signal line 16 are provided for each column of the pixels 12, and signals from the pixels 12 are read out to the column signal line 16 in each column.

The load circuit unit 30 includes load circuits 32 corresponding to respective columns of the pixels 12. The load circuit 32 supplies a bias current for reading signals from the pixels 12 to the column signal line 16 of the corresponding column. The signal holding unit 40 includes sample and hold units 42 corresponding to respective columns of the pixels 12. The sample and hold unit 42 holds signals output from the pixels 12.

The AD conversion unit 50 includes analog-to-digital conversion circuits (AD conversion circuits) 52 corresponding to respective columns of the pixels 12. The AD conversion circuit 52 converts an analog signal based on the signal held in the sample and hold unit 42 into a digital signal. The digital memory unit 60 includes digital memories 62 corresponding to respective columns of the pixels 12. The digital memory 62 stores the digital signal output from the AD conversion unit 50.

The horizontal scanning circuit 64 supplies control signals for performing control for sequentially outputting digital signals from the digital memory unit 60 to the digital signal processing unit 70 for each column. The horizontal scanning circuit 64 may include a shift register or an address decoder. The digital signal processing unit 70 is a circuit that performs various kinds of signal processing on the input digital signal. The output unit 80 outputs the processed digital signal to the outside of the photoelectric conversion device 100. The control circuit 90 controls the operation timing and the like of the vertical scanning circuit 20, the load circuit unit 30, the signal holding unit 40, the analog-to-digital conversion unit (AD conversion unit) 50, the digital memory unit 60, the horizontal scanning circuit 64, and the output unit 80.

As described above, the load circuit 32, the sample and hold unit 42, the AD conversion circuit 52, and the digital memory 62 are arranged corresponding to each column of the pixel array 10. These circuits for reading signals corresponding to each column of the pixel array 10 may be referred to as a column circuit.

Figure 2:
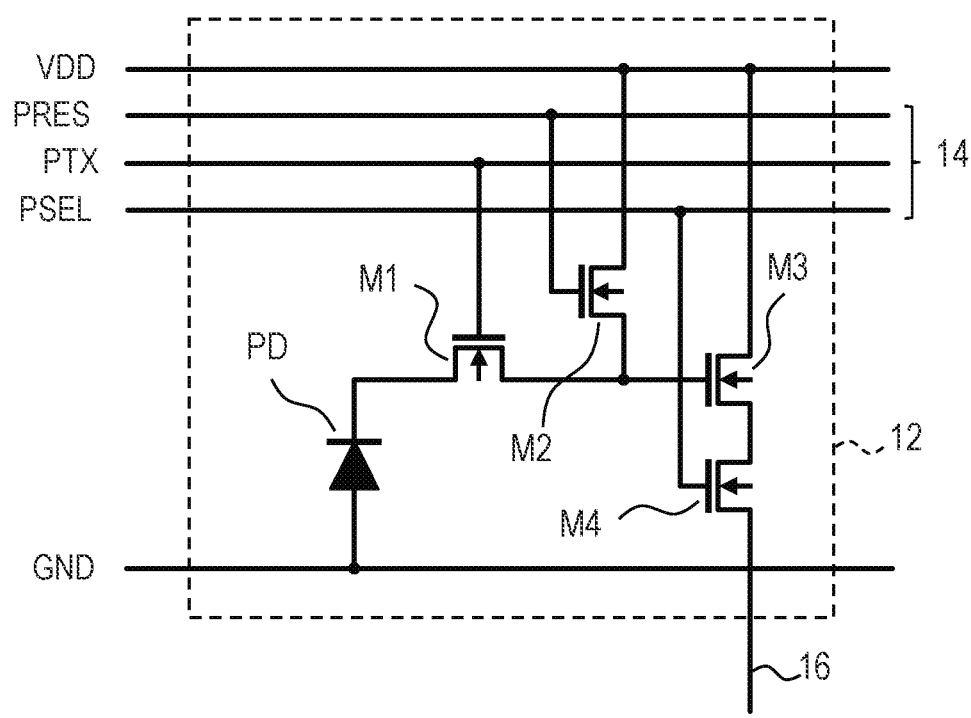
FIG. 2 is a circuit diagram of a pixel according to the first embodiment.

FIG. 2 is a circuit diagram of the pixel 12 according to the present embodiment. The pixel 12 includes a photoelectric conversion unit PD, a transfer transistor M1, a reset transistor M2, an amplifier transistor M3, and a select transistor M4. These transistors may be configured by N-type MOS transistors having gate electrodes as control electrodes. Control signals PTX, PRES, and PSEL for controlling these transistors are input to the gates of the transfer transistor M1, the reset transistor M2, and the select transistor M4 from the vertical scanning circuit 20 via the control signal line 14, respectively.

The photoelectric conversion unit PD is a photoelectric conversion element that generates charges corresponding to incident light by photoelectric conversion and accumulates the charges. The photoelectric conversion unit PD may be configured by a photodiode formed in a semiconductor substrate. The anode of the photodiode constituting the photoelectric conversion unit PD is connected to a potential line having a ground potential GND, and the cathode thereof is connected to the source of the transfer transistor M1.

The drain of the transfer transistor M1, the source of the reset transistor M2, and the gate of the amplifier transistor M3 are connected to each other. This connection node is a so-called floating diffusion. The transfer transistor M1 is turned on to transfer the charges of the photoelectric conversion unit PD to the floating diffusion. The floating diffusion has a capacitance, and the potential of the floating diffusion changes according to the charges transferred from the photoelectric conversion unit PD by the capacitance.

The drain of the reset transistor M2 and the drain of the amplifier transistor M3 are connected to a potential line having a power supply potential VDD. The source of the amplifier transistor M3 is connected to the drain of the select transistor M4. The source of the select transistor M4 is connected to the column signal line 16. The amplifier transistor M3 constitutes a source follower circuit together with a current source in the load circuit 32 connected to the column signal line 16. The source follower circuit outputs a signal based on the voltage of the floating diffusion to the column signal line 16 via the select transistor M4. The reset transistor M2 is turned on to reset the potential of the floating diffusion.

Each of the pixels 12 may have a microlens and a color filter arranged on an optical path in which incident light is guided to the photoelectric conversion unit PD. The microlens focuses incident light on the photoelectric conversion unit PD. The color filter selectively transmits light of a predetermined color.

Figure 3:
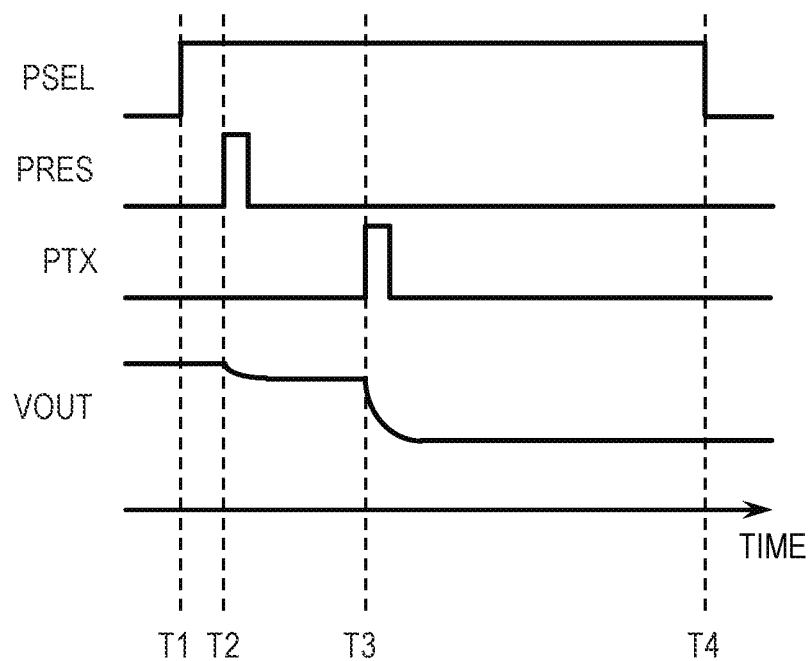
FIG. 3 is a timing chart illustrating a signal reading operation from a pixel according to the first embodiment.

FIG. 3 is a timing chart illustrating a signal reading operation from the pixel 12 according to the present embodiment. FIG. 3 illustrates the timing of the control signals PSEL, PRES, and PTX output from the vertical scanning circuit 20 to one row of the plurality of pixels 12 and an output potential VOUT output from the pixel 12 to the column signal line 16 of the corresponding column.

At time T1, the control signal PSEL becomes a high level. Thereby, the select transistor M4 is turned on, the pixels 12 in the row are selected, and a signal based on the voltage of the floating diffusion is output to the column signal line 16.

At time T2, the control signal PRES becomes a high level, and then becomes a low level. By this operation, the reset transistor M2 is temporarily turned on, and the potential of the floating diffusion is reset to a potential corresponding to the power supply potential VDD. Thus, the output potential VOUT becomes a potential based on the reset state of the pixel 12. This potential is held as a reset signal (second signal) in the sample and hold unit 42.

At time T3, control signal PTX becomes a high level, and then becomes a low level. By this operation, the transfer transistor M1 is temporarily turned on, and charges accumulated in the photoelectric conversion unit PD are transferred to the floating diffusion. Thus, the output potential VOUT becomes a potential based on the charges accumulated in the photoelectric conversion unit PD in response to the incident light. This potential is held as a pixel signal (first signal) in the sample and hold unit 42.

At time T4, the control signal PSEL becomes a low level. Thereby, the select transistor M4 is turned off, and the selection of the pixels 12 in the row is released.

Figure 4:
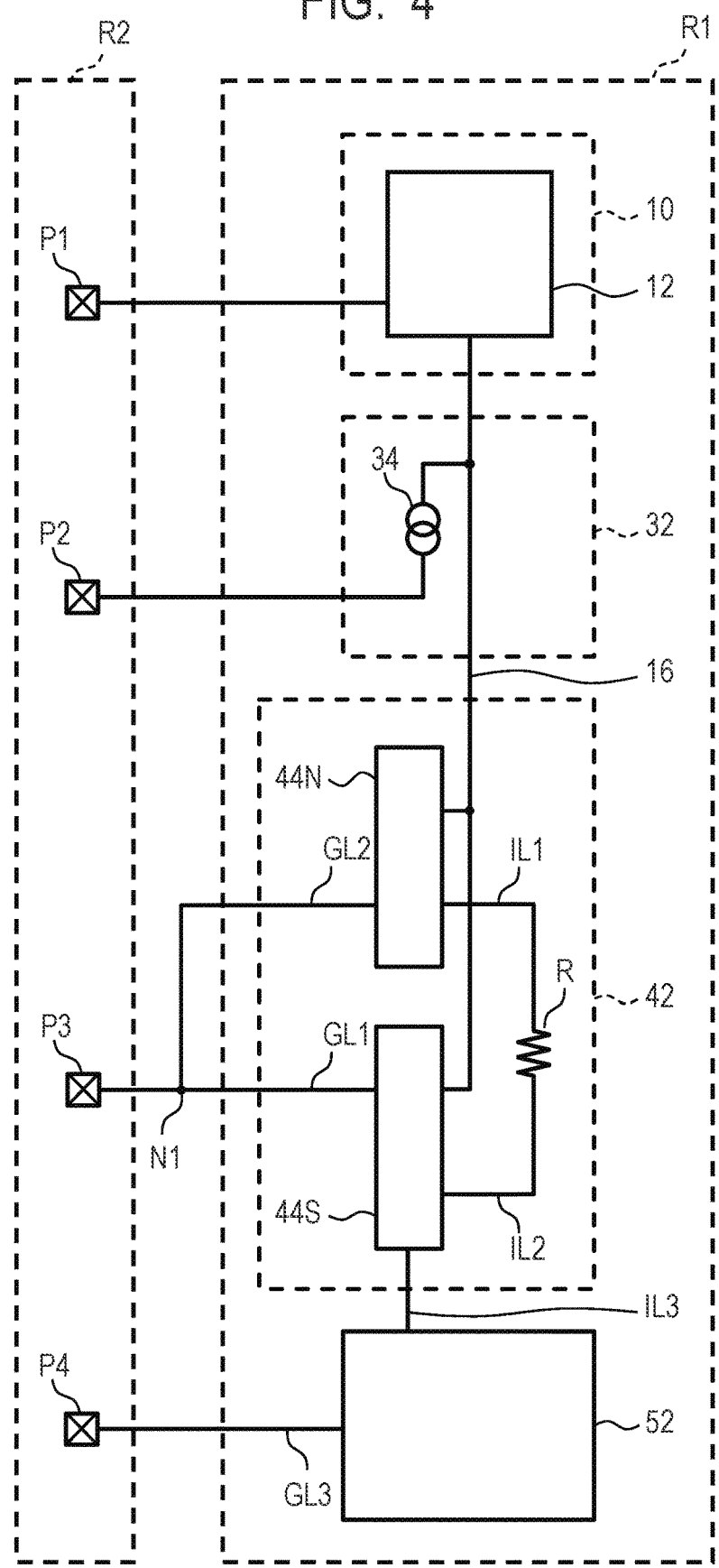
FIG. 4 is a block diagram illustrating a circuit configuration of one column and connection of wirings according to the first embodiment.

FIG. 4 is a block diagram illustrating the circuit configuration of one column and the connection of wirings according to the present embodiment. In FIG. 4, the pixel 12 described in FIG. 1 and a part of blocks of the column circuits corresponding to the pixel 12 are extracted by one column.

FIG. 4 illustrates an element region R1 of the photoelectric conversion device 100 in which the pixel array 10, the column circuits, and the like are arranged, and a pad region R2 in which pads as external terminals for supplying driving potentials to the photoelectric conversion device 100 from the outside are arranged. The element region R1 and the pad region R2 may be arranged in different regions on the semiconductor substrate. FIG. 4 schematically illustrates that the pixel array 10, the load circuit 32, the sample and hold unit 42, and the AD conversion circuit 52 are arranged in the element region RE Also, FIG. 4 schematically illustrates that pads P1, P2, P3, and P4 are arranged in the pad region R2. The pads P1, P2, P3, and P4 may be metal films to which mounting members such as bonding wires and bumps are connected, for example.

It should be noted that, in the following description, the pads P1, P2, P3, and P4 are ground terminals for supplying the ground potential, but these pads may be power supply terminals for supplying the power supply potential or reference potential terminals for supplying a reference potential of each circuit. The ground potential, the power supply potential, and the reference potential are sometimes referred to as a driving potential as more general term. In other words, the pads P1, P2, P3, and P4 may be external terminals for supplying the driving potential to each circuit of the photoelectric conversion device 100.

The pixel array 10 has the plurality of pixels 12, and the ground line of the pixel 12 is connected to the pad P1. The load circuit 32 includes a current source 34 connected to the column signal line 16. The ground line of the current source 34 is connected to the pad P2.

The sample and hold unit 42 includes a first sample and hold unit 44S, a second sample and hold unit 44N, and a resistor R. The column signal line 16 is connected to the first sample and hold unit 44S and the second sample and hold unit 44N. The first sample and hold unit 44S acquires and holds the pixel signal output from the pixel 12 via the column signal line 16. The second sample and hold unit 44N acquires and holds the reset signal output from the pixel 12 via the column signal line 16.

The second sample and hold unit 44N is connected to the first sample and hold unit 44S via a signal line ILL the resistor R, and a signal line IL2 in this order. Thus, the second sample and hold unit 44N can supply a current based on the held reset signal to the first sample and hold unit 44S.

The first sample and hold unit 44S outputs a current based on a difference between the pixel signal and the reset signal to the AD conversion circuit 52 via a signal line IL3. As a result, a correction processing by a correlated double sampling of the pixel signal and the reset signal is performed.

The ground line GL1 (first potential line) of the first sample and hold unit 44S and the ground line GL2 (second potential line) of the second sample and hold unit 44N are commonly connected at a node N1 outside the element region RE The common ground line is connected to the pad P3. The node N1 may be in the element region R1 or the pad region R2, and the ground line may be commonly connected at a node closer to the sample and hold unit 42 than at least the pad P3. The ground line GL3 (third potential line) of the AD conversion circuit 52 is connected to the pad P4.

Figure 5:
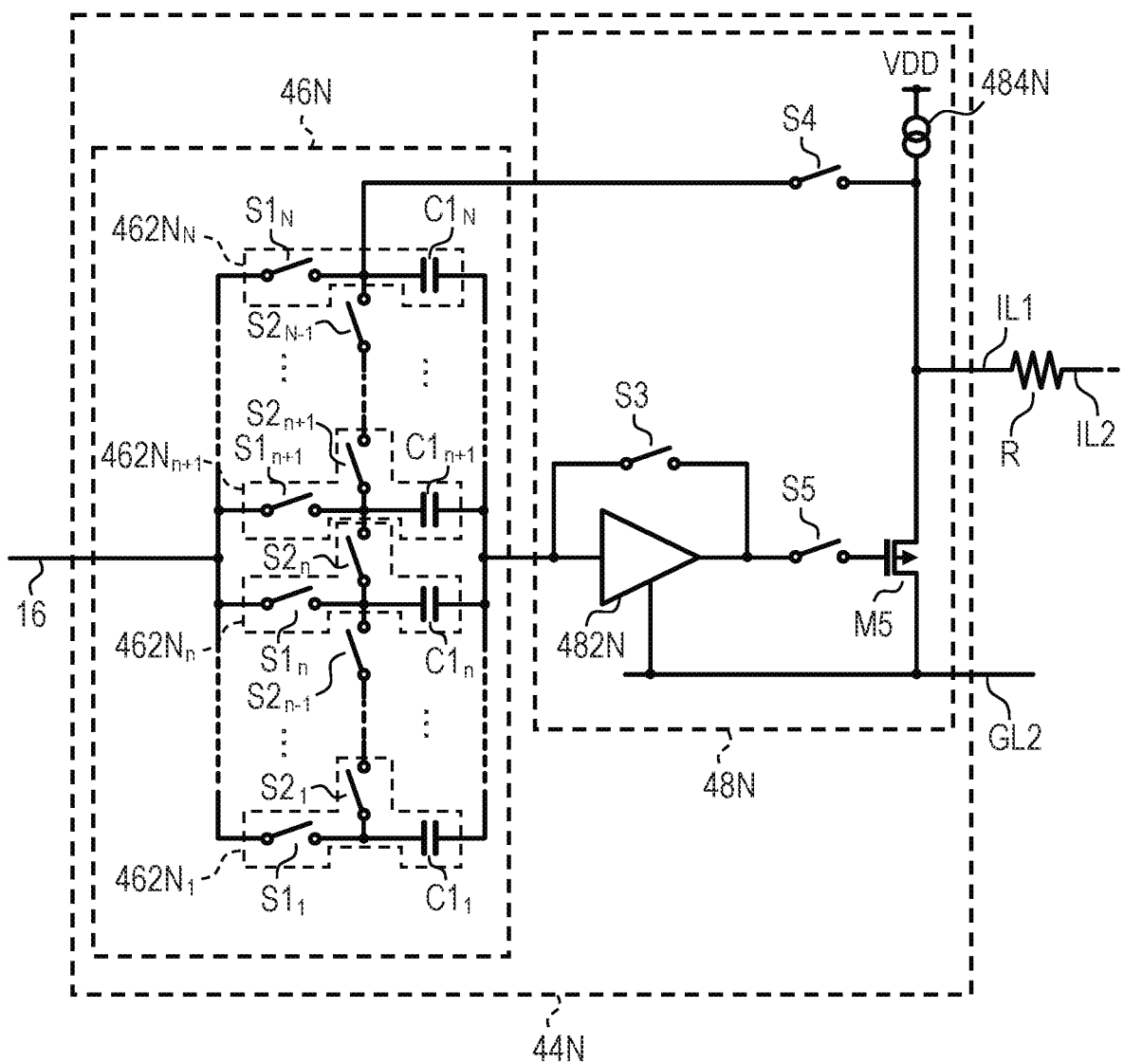
FIG. 5 is a block diagram illustrating a configuration of a second sample and hold unit for a reset signal according to the first embodiment.

FIG. 5 is a block diagram illustrating a configuration of the second sample and hold unit 44N for reset signals according to the present embodiment. The second sample and hold unit 44N includes a sample and hold circuit group 46N and an amplifying unit 48N.

The sample and hold circuit group 46N includes N sample and hold circuits $462N_1$ to $462N_n$ to $462N_N$ (N is an integer of two or more, and n is an integer of one or more and less than N). The sample and hold circuit $462N_1$ includes switches $S1_1$ and $S2_1$ and a capacitor $C1_1$. The sample and hold circuit $462N_n$ includes switches $S1_n$ and $S2_n$ and a capacitor $C1_1$. Thus, each of the sample and hold circuits $462N_1$ to $462N_{N-1}$ includes two switches and one capacitor. The sample and hold circuit $462N_N$ includes a switch $S1_N$ and a capacitor $C1_N$.

The amplifying unit 48N includes an inverting amplifier 482N, a transistor M5, a current source 484N, and switches S3, S4, and S5. The transistor M5 is a P-type MOS transistor. The plurality of switches included in the sample and hold circuit group 46N and the amplifying unit 48N are controlled to be on or off under the control of the control circuit 90.

The column signal line 16 is connected to the first terminals of the switches $S1_1$ to $S1_N$. The second terminal of the switch $S1_1$ is connected to the first terminal of the switch $S2_1$ and the first terminal of the capacitor $C1_1$. The second terminal of the switch $S2_1$ is connected to the second terminal of the switch $S1_2$, the first terminal of the switch $S2_2$, and the first terminal of the capacitor $C1_2$ included in the adjacent sample and hold circuit $462N_2$. The sample and hold circuits $462N_2$ to $462N_{N-1}$ have similar configurations. The second terminal of the switch $S1_N$ is connected to the second terminal of the switch $S2_{N-1}$, the first terminal of the capacitor $C1_N$, and the first terminal of the switch S4. The second terminals of the capacitors $C1_1$ to $C1_N$ are connected to the input terminal of the inverting amplifier 482N and the first terminal of the switch S3.

The output terminal of the inverting amplifier 482N is connected to the second terminal of the switch S3 and the first terminal of the switch S5. The second terminal of the switch S5 is connected to the gate of the transistor M5. The second terminal of the switch S4 is connected to the current source 484N and the source of the transistor M5. A power supply terminal of the current source 484N is connected to a potential line having a power supply potential VDD. The connection node of the second terminal of the switch S4, the current source 484N and the source of the transistor M5 forms the output terminal of the second sample and hold unit 44N, and is connected to the signal line ILL The ground terminal of the inverting amplifier 482N and the drain of the transistor M5 are connected to the ground line GL2.

Thus, the amplifying unit 48N forms an amplifier circuit in which the inverting amplifier 482N (second inverting amplifier) and the source follower circuit (second source follower circuit) including the current source 484N and the transistor M5 are cascade-connected. The amplifying unit 48N can output a current corresponding to the voltage held in the capacitors $C1_1$ to $C1_N$ to the signal line IL1.

Figure 6:
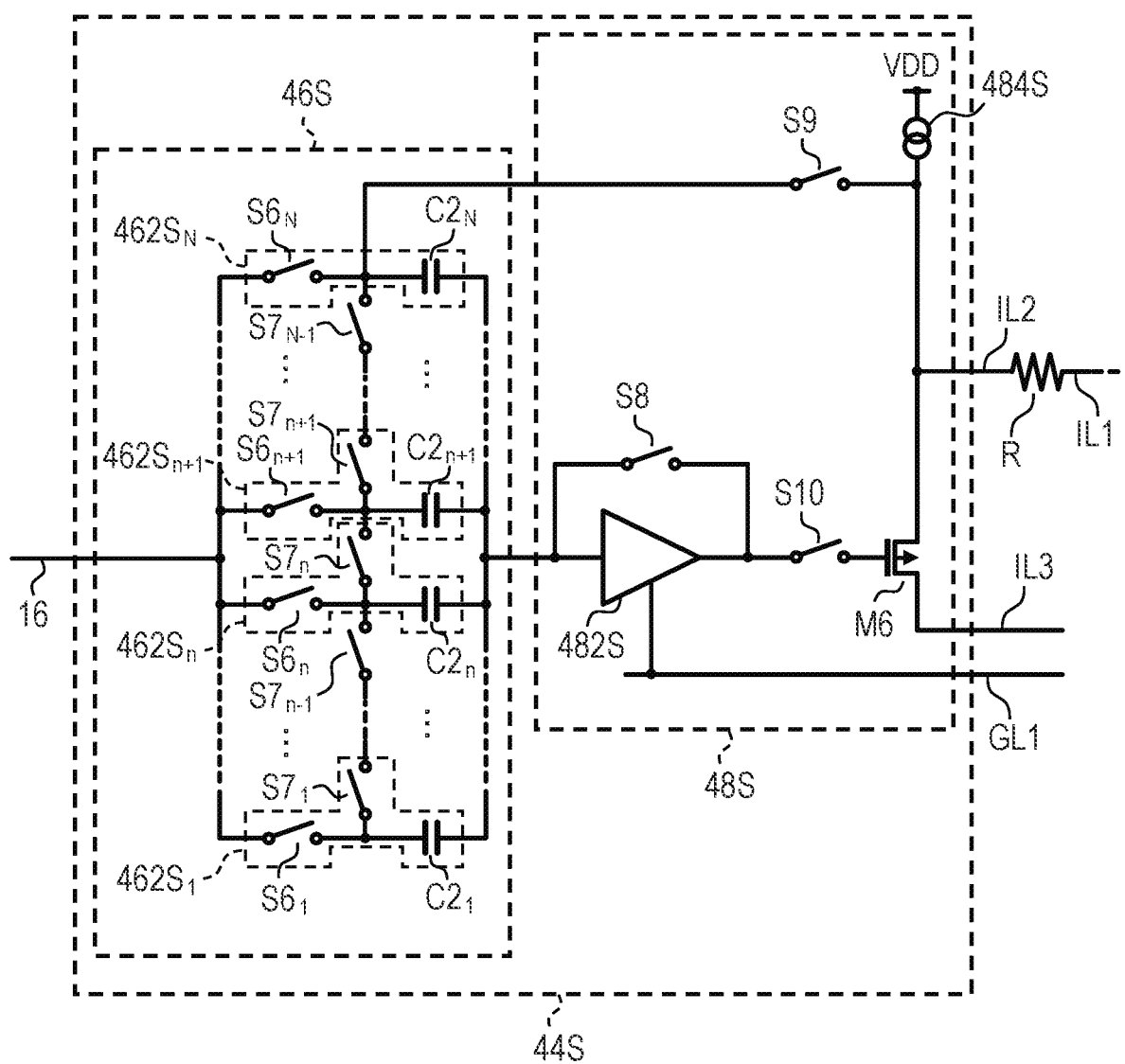
FIG. 6 is a block diagram illustrating a configuration of a first sample and hold unit for a pixel signal according to the first embodiment.

FIG. 6 is a block diagram illustrating a configuration of the first sample and hold unit 44S for pixel signals according to the present embodiment. The first sample and hold unit 44S includes a sample and hold circuit group 46S and an amplifying unit 48S.

The sample and hold circuit group 46S includes N sample and hold circuits $462S_1$ to $462S_n$ to $462S_N$. The sample and hold circuit $462S_1$ includes switches $S6_1$ and $S7_1$ and a capacitor $C2_1$. The sample and hold circuit $462S_n$ includes switches $S6_n$ and $S7_n$ and a capacitor $C2_n$. Thus, each of the sample and hold circuits $462S_1$ to $462S_{N-1}$ includes two switches and one capacitor. The sample and hold circuit $462S_N$ includes a switch $S6_N$ and a capacitor $C2_N$. The connection relationship of the circuits in the sample and hold circuit group 46S is similar to that in the sample and hold circuit group 46N, and therefore the description thereof will be omitted.

The amplifying unit 48S includes an inverting amplifier 482S, a transistor M6, a current source 484S, and switches S8, S9, and S10. The transistor M6 is a P-type MOS transistor. The plurality of switches included in the sample and hold circuit group 46S and the amplifying unit 48S are controlled to be on or off under the control of the control circuit 90.

The connection relationship among the inverting amplifier 482S, the transistor M6, the current source 484S, and the switches S8, S9, and S10 is substantially the same as that of the amplifying unit 48N. Therefore, differences from the amplifying unit 48N will be described below.

A connection node of the second terminal of the switch S9, the current source 484S, and the source of the transistor M6 are connected to the signal line IL2. A current is input to this node from the second sample and hold unit 44N. The ground terminal of the inverting amplifier 482S is connected to the ground line GL1. The drain of the transistor M6 forms the output terminal of the first sample and hold unit 44S and is connected to the signal line IL3.

The amplifying unit 48S forms an amplifier circuit in which an inverting amplifier 482S (first inverting amplifier) and a source follower circuit (first source follower circuit) including a current source 484S and a transistor M6 are cascade-connected. The amplifying unit 48S can output a current corresponding to a difference between the current corresponding to the voltage held in the capacitors $C2_1$ to $C2_N$ and the current input from the signal line IL2 to the signal line IL3.

An outline of the operation of the sample and hold unit 42 will be described with reference to FIG. 3 to FIG. 6. During the output period of the reset signal from time T2 to time T3 in FIG. 3, the switches $S1_1$ to $S1_N$, S3, $S6_{n+1}$ to $S6_N$, and S8 are turned on. During this period, the other switches are in the off state. Thereafter, the switches $S1_1$ to $S1_N$, S3, $S6_{n+1}$ to $S6_N$, and S8 are turned off. By these operations, the voltage based on the reset signal is held in the capacitors $C1_1$ to $C1_N$ and $C2_{n+1}$ to $C2_N$.

Thereafter, during the output period of the pixel signal from time T3 to time T4 in FIG. 3, the switches $S2_1$ to $S2_{N-1}$, S4, S5, $S6_1$ to $S6_n$, and S8 are turned on. During this period, the other switches are in the off state. By this operation, the capacitors $C1_1$ to $C1_N$ are connected in parallel, and the second sample and hold unit 44N outputs a current corresponding to the voltage held in the capacitors $C1_1$ to $C1_N$ to the signal line IL1. After that, the switches $S6_1$ to $S6_n$ and S8 are turned off. By these operations, the voltage based on the pixel signal is held in the capacitors $C2_1$ to $C2_n$.

Thereafter, the switches $S2_1$ to $S2_{N-1}$, S4, S5, $S7_1$ to $S7_{N-1}$, S9, and S10 are turned on. The other switches are in the off state. By this operation, the capacitors $C2_1$ to $C2_N$ are connected in parallel, and the first sample and hold unit 44S outputs a current corresponding to a difference between the current corresponding to the voltage held in the capacitors $C2_1$ to $C2_N$ and the current input from the signal line IL2 to the signal line IL3.

By the above operation, a current signal subjected to a correction processing by a correlated double sampling of the pixel signal and the reset signal can be output to the signal line IL3. In the sample and hold circuit group 46S, the pixel signals held in the n capacitors $C2_1$ to $C2_n$ and the reset signals held in the (N−n) capacitors $C2_{n+1}$ to $C2_N$ are weighted-averaged according to the number of capacitors. Thus, the voltage of the difference between the reset signal and the pixel signal is attenuated by (n/N) times. Therefore, the voltage range of the input signal in the column circuit can be extended.

Figure 7:
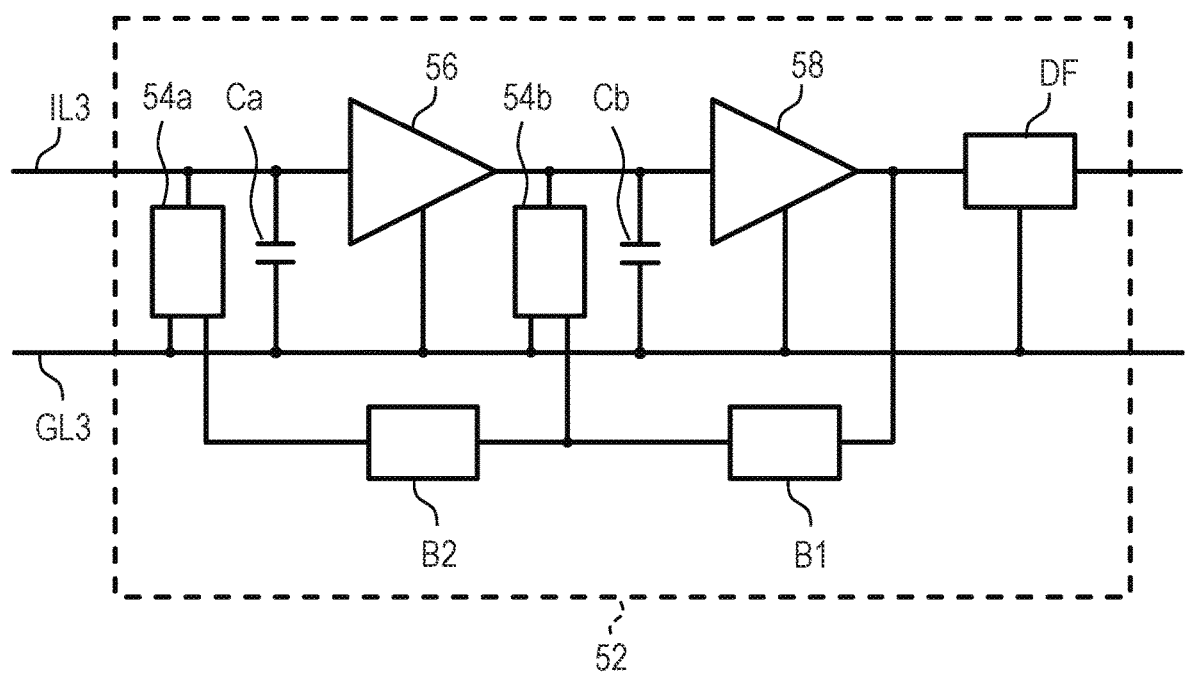
FIG. 7 is a block diagram illustrating a configuration of an AD conversion unit according to the first embodiment.

FIG. 7 is a block diagram illustrating a configuration of the AD conversion circuit 52 according to the present embodiment. Although the AD conversion circuit 52 illustrated in the present embodiment is a delta-sigma AD conversion circuit, the AD conversion circuit 52 is not limited thereto. For example, the AD conversion circuit 52 may be an AD conversion circuit that compares a ramp signal and an input voltage and measures the time until a magnitude relation of these is inverted by using a counter. The AD conversion circuit 52 may be a successive-approximation AD conversion circuit that acquires a digital value close to the input voltage by repeatedly comparing an output voltage of the DA conversion circuit and an input voltage. Although a 1-bit AD conversion circuit is exemplified in the present embodiment, the number of bits is not limited to this, and AD conversion of a larger number of bits may be actually performed.

The AD conversion circuit 52 includes digital-to-analog conversion circuits (DA conversion circuits) 54a and 54b, capacitors Ca and Cb, a voltage-to-current conversion unit 56, a quantizer 58, a decimation filter DF, and buffers B1 and B2. As described above, the current signal after the processing by the correlated double sampling is input from the sample and hold unit 42 to the AD conversion circuit 52 via the signal line IL3.

The signal line IL3 is connected to the output terminal of the DA conversion circuit 54a, the first terminal of the capacitor Ca, and the input terminal of the voltage-to-current conversion unit 56. The output terminal of the voltage-to-current conversion unit 56 is connected to the output terminal of the DA conversion circuit 54b, the first terminal of the capacitor Cb, and the input terminal of the quantizer 58. The output terminal of the quantizer 58 is connected to the input terminal of the decimation filter DF and the input terminal of the buffer B1. The output terminal of the buffer B1 is connected to the input terminal of the DA conversion circuit 54b and the input terminal of the buffer B2. The output terminal of the buffer B2 is connected to the input terminal of the DA conversion circuit 54a. The ground terminals of the DA conversion circuits 54a and 54b, the second terminals of the capacitors Ca and Cb, the ground terminal of the voltage-to-current conversion unit 56, the ground terminal of the quantizer 58, and the ground terminal of the decimation filter DF are connected to the ground line GL3. The output terminal of the decimation filter DF is the output terminal of the AD conversion circuit 52.

Charges are accumulated in the capacitor Ca in accordance with the amount of current flowing through the signal line IL3 and the passage of time. The voltage-to-current conversion unit 56 outputs a current signal corresponding to the potential of the first terminal of the capacitor Ca from the output terminal. Thus, the capacitor Ca functions as an integrator.

Charges are accumulated in the capacitor Cb in accordance with the amount of current output from the voltage-to-current conversion unit 56 and the passage of time. Thus, the capacitor Cb and the voltage-to-current conversion unit 56 function as an integrator. The quantizer 58 may be a comparison circuit. The quantizer 58 compares the potential of the first terminal of the capacitor Cb with a predetermined threshold value, and outputs a 1-bit digital signal indicating the comparison result. Thus, the quantizer 58 performs 1-bit analog-to-digital conversion. The quantizer 58 performs oversampling at a frequency higher than a desired sampling frequency.

The digital signal output from the quantizer 58 is input to the buffer B1. The digital signal is fed back to the DA conversion circuits 54a and 54b via the buffers B1 and B2. The DA conversion circuits 54a and 54b include a current source, a switch, and the like. The DA conversion circuit 54a performs digital-to-analog conversion in which a current corresponding to the input digital signal flows, thereby extracting charges corresponding to the digital signal from the first terminal of the capacitor Ca and flowing the charges to the ground line GL3. Similarly, the DA conversion circuit 54b extracts an amount of charges corresponding to the input digital signal from the first terminal of the capacitor Cb and flows the charges to the ground line GL3. In this way, the digital signal output from the quantizer 58 is fed back to the input side of the integrator or quantizer 58. This feedback loop operates to reduce quantization errors in the low frequency domain.

As illustrated in FIG. 7, since the AD conversion circuit 52 of the present embodiment tends to have a circuit arrangement extending in one direction, the feedback wiring may be long. The buffers B1 and B2 reduce the influence of a voltage drop or the like caused by the long feedback wiring. However, the buffers B1 and B2 may not be provided when the influence of the feedback wiring is acceptable.

The decimation filter DF performs a process of decreasing the sampling frequency by decimating the signal output from the quantizer 58. Thus, noise in the high frequency domain is reduced.

As described above, the AD conversion circuit 52 of the present embodiment employs a delta-sigma type suitable for high accuracy and high resolution. Thus, a high-accuracy digital signal can be output.

In the present embodiment, as illustrated in FIG. 4, the ground line GL1 of the first sample and hold unit 44S and the ground line GL2 of the second sample and hold unit 44N are commonly connected. An effect of the configuration will be described. The potential of the ground line may vary due to the influence of the operation of the circuit in the photoelectric conversion device 100, external noise, or the like. This potential variation may reduce the accuracy of the output signal.

In the present embodiment, the ground line GL1 of the first sample and hold unit 44S and the ground line GL2 of the second sample and hold unit 44N are commonly connected. Therefore, the influence of the fluctuation of the ground potential is superimposed on the first sample and hold unit 44S and the second sample and hold unit 44N to the same extent. Here, the reset signal held in the second sample and hold unit 44N is a signal used for correlated double sampling with the pixel signal held in the first sample and hold unit 44S. Therefore, the influence of noise received by the second sample and hold unit 44N and the first sample and hold unit 44S due to the variation in the potential of the ground line is reduced by performing correlated double sampling. Therefore, according to the present embodiment, the photoelectric conversion device 100 with improved accuracy is provided.

Second Embodiment

The photoelectric conversion device 100 of the present embodiment is a modified example in which a commonly connected position of the ground line GL1 of the first sample and hold unit 44S and the ground line GL2 of the second sample and hold unit 44N is changed from the configuration of the first embodiment. Other elements are the same as those in the first embodiment, and thus description thereof will be omitted.

Figure 8:
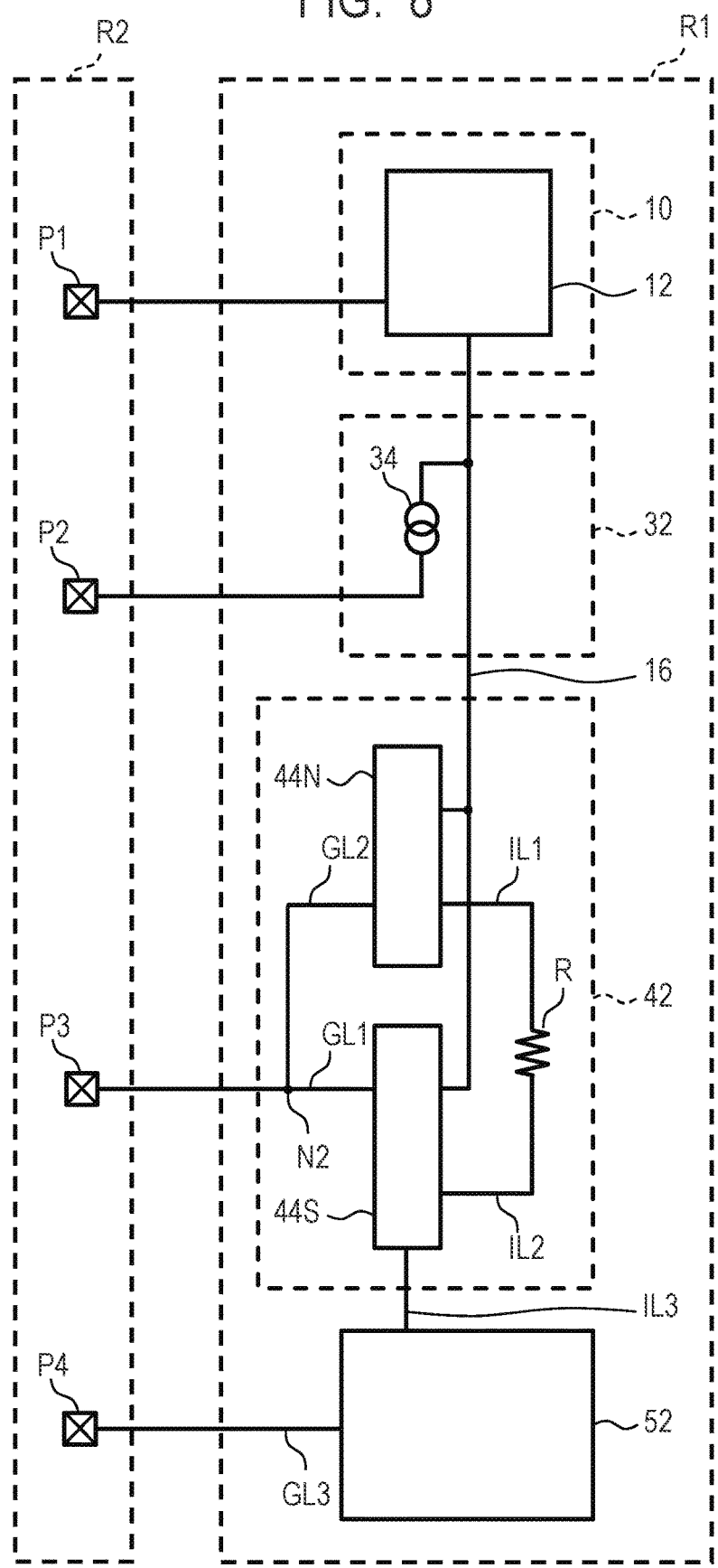
FIG. 8 is a block diagram illustrating a circuit configuration of one column and connection of wirings according to a second embodiment.

FIG. 8 is a block diagram illustrating the circuit configuration of one column and the connection of wirings according to the present embodiment. As illustrated in FIG. 8, the ground line GL1 of the first sample and hold unit 44S and the ground line GL2 of the second sample and hold unit 44N are commonly connected at a node N2 in the sample and hold unit 42. Although only one column is illustrated in FIG. 8, the node N2 at which the ground lines are commonly connected may be provided for each column circuit.

In the present embodiment, as in the first embodiment, the ground lines are not commonly connected outside the element region R1, but the common node N2 is provided for each column. Since the ground lines are commonly connected for each unit of the correlated double sampling, the effect of noise reduction may be further improved.

In the configuration of the first embodiment, the ground lines are commonly connected at the node N1 closer to the pad P3. Further, the node N1 may be commonly provided for a plurality of column circuits. In this configuration, common impedance caused by the line between the node N1 and the pad P3 may be reduced. Therefore, depending on the design, the configuration of the first embodiment may reduce noise. The configuration of the first embodiment and the configuration of the second embodiment may be appropriately selected in consideration of conditions such as circuit design and layout.

Third Embodiment

The photoelectric conversion device 100 of the present embodiment is a modified example in which the configuration of the ground lines of the AD conversion circuit 52 is changed from the configuration of the first embodiment. Other elements are the same as those in the first embodiment, and thus description thereof will be omitted.

Figure 9:
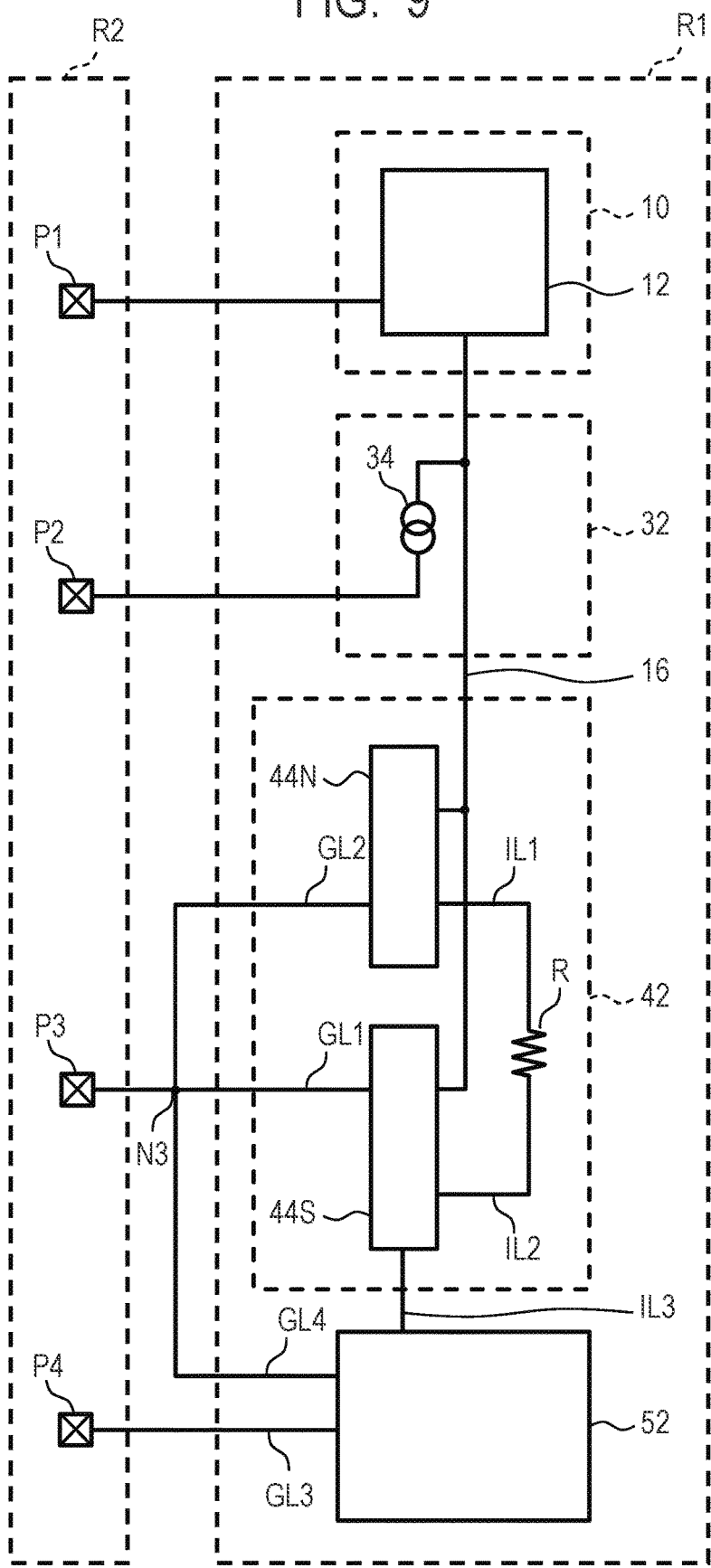
FIG. 9 is a block diagram illustrating a circuit configuration of one column and connection of wirings according to a third embodiment.

FIG. 9 is a block diagram illustrating the circuit configuration of one column and the connection of wirings according to the present embodiment. As illustrated in FIG. 9, a ground line GL4 (fourth potential line) of a part of the circuits of the AD conversion circuit 52 is commonly connected with the ground line GL1 and the ground line GL2 at a node N3.

Figure 10:
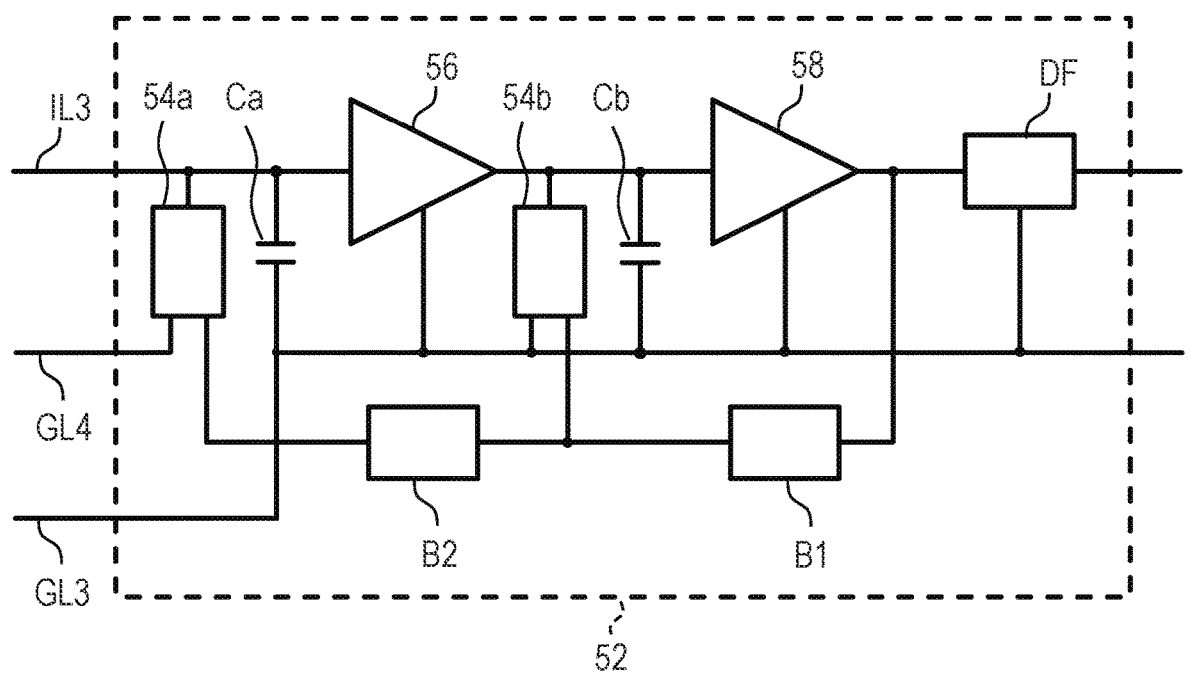
FIG. 10 is a block diagram illustrating a configuration of an AD conversion unit according to the third embodiment.

FIG. 10 is a block diagram illustrating a configuration of the AD conversion circuit 52 according to the present embodiment. As illustrated in FIG. 10, the ground terminal of the DA conversion circuit 54a is connected to the ground line GL4. The ground terminal of the DA conversion circuit 54b, the second terminals of the capacitors Ca and Cb, the ground terminal of the voltage-to-current conversion unit 56, the ground terminal of the quantizer 58, and the ground terminal of the decimation filter DF are connected to the ground line GL3.

In the present embodiment, the ground line GL3 connected to a part where the AD conversion operation is performed, such as the quantizer 58, in the AD conversion circuit 52 is separated from the ground line GL4 of the DA conversion circuit 54a arranged at the input side of the AD conversion circuit 52. As a result, kickback in which fluctuations in potential that may be caused by the AD conversion operation affect the node on the input side may be reduced. Further, since the ground line GL3 is also separated from the ground of the first sample and hold unit 44S and the second sample and hold unit 44N, kickback to the first sample and hold unit 44S and the second sample and hold unit 44N is also reduced. Therefore, according to the present embodiment, the photoelectric conversion device 100 with improved accuracy is provided.

Also in the present embodiment, as in the first embodiment, the ground line GL1 and the ground line GL2 are commonly connected at the node N3. Thus, the influence of noise on the first sample and hold unit 44S and the second sample and hold unit 44N may be reduced for the same reason as in the first embodiment.

Fourth Embodiment

The photoelectric conversion device 100 of the present embodiment is a modified example in which a position where the ground lines GL1, GL2, and GL4 are commonly connected is changed from the configuration of the third embodiment. Other elements are the same as those of the third embodiment, and thus description thereof will be omitted.

Figure 11:
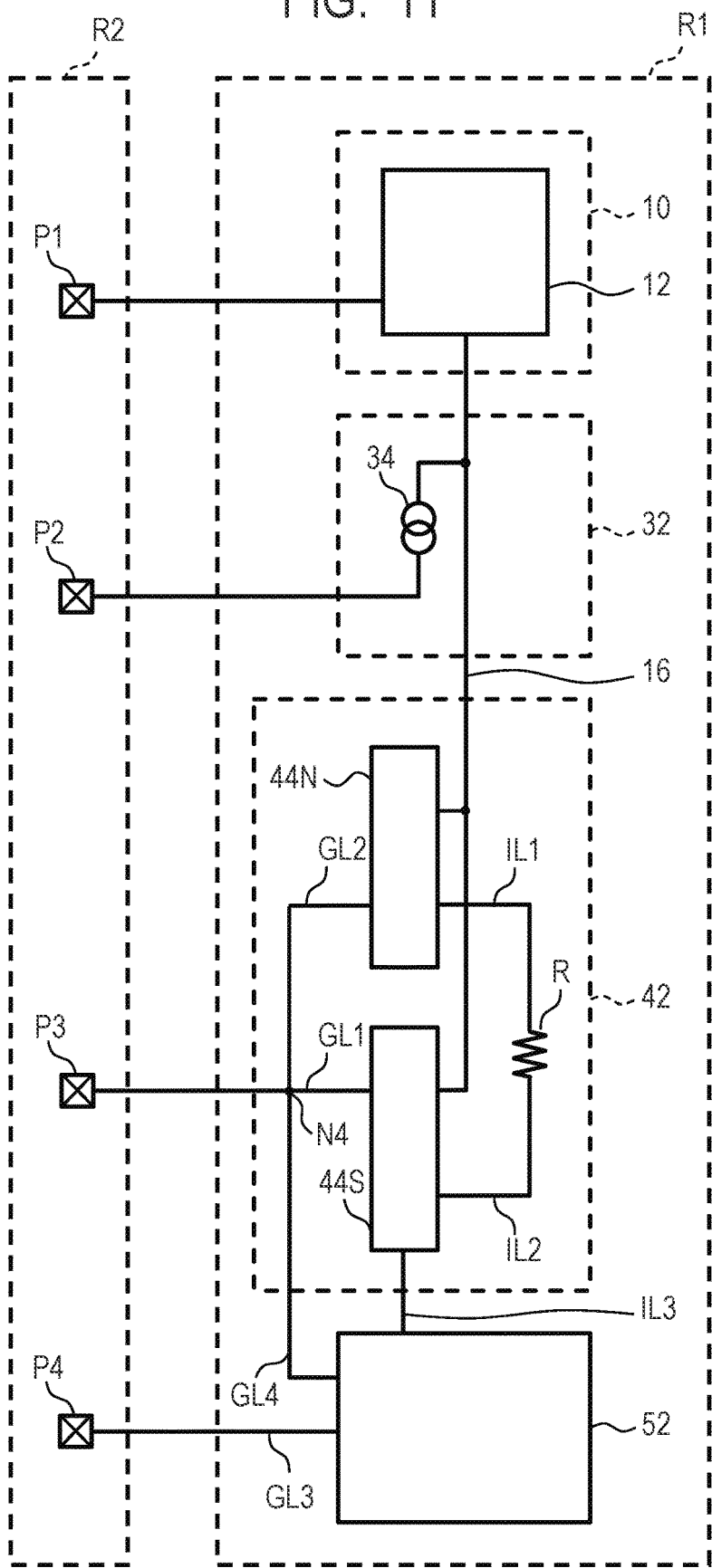
FIG. 11 is a block diagram illustrating a circuit configuration of one column and connection of wirings according to a fourth embodiment.

FIG. 11 is a block diagram illustrating the circuit configuration of one column and the connection of wirings according to the present embodiment. As illustrated in FIG. 11, the ground line GL1, the ground line GL2, and the ground line GL4 are commonly connected at a node N4 in the sample and hold unit 42. Although only one column is illustrated in FIG. 11, the node N4 at which the ground lines are commonly connected may be provided for each column circuit.

In the present embodiment, as in the third embodiment, the ground lines are not commonly connected outside the element region R1, but the common node N4 is provided for each column. Since the ground lines are commonly connected for each unit of the correlated double sampling and AD conversion, the effect of noise reduction may be further improved.

In the configuration of the third embodiment, the ground lines are commonly connected at the node N3 closer to the pad P3. Further, the node N3 may be commonly provided for a plurality of column circuits. In this configuration, common impedance caused by the line between the node N3 and the pad P3 may be reduced. Therefore, depending on the design, the configuration of the third embodiment may reduce noise. The configuration of the third embodiment and the configuration of the fourth embodiment may be appropriately selected in consideration of conditions such as circuit design and layout.

Fifth Embodiment

The photoelectric conversion device 100 of the present embodiment is a modified example in which the configuration of the ground line GL1 of the first sample and hold unit 44S and the arrangement of the pads are changed from the configuration of the third embodiment. Other elements are the same as those of the third embodiment, and thus description thereof will be omitted.

Figure 12:
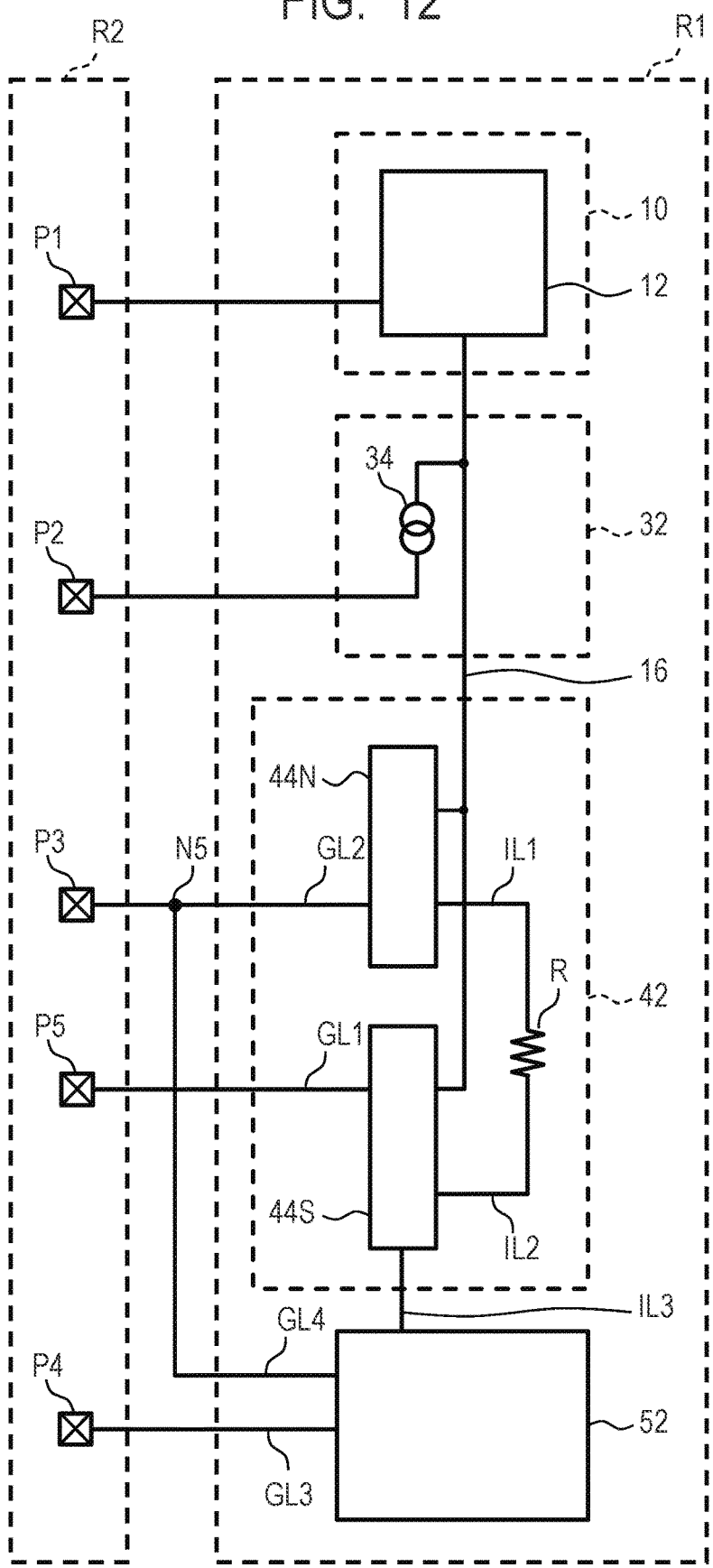
FIG. 12 is a block diagram illustrating a circuit configuration of one column and connection of wirings according to a fifth embodiment.

FIG. 12 is a block diagram illustrating the circuit configuration of one column and the connection of wirings according to the present embodiment. As illustrated in FIG. 12, the ground line GL4 of a part of the circuits of the AD conversion circuit 52 is commonly connected to the ground line GL2 of the second sample and hold unit 44N at a node N5. The node N5 is connected to the pad P3. The ground line GL1 of the first sample and hold unit 44S is not connected to the node N5 but is connected to the pad P5.

Also in the present embodiment, similarly to the third embodiment, since the ground line GL3 and the ground line GL4 are separated from each other, an effect of reducing noise by reducing kickback may be obtained. Therefore, according to the present embodiment, the photoelectric conversion device 100 with improved accuracy is provided.

In FIG. 12, the ground line GL4 is commonly connected to the ground line GL2 at the node N5, and the ground line GL1 is separated from those ground lines. However, the ground line GL4 may be commonly connected to the ground line GL1, and the ground line GL2 may be separated from those ground lines.

Sixth Embodiment

The photoelectric conversion device 100 of the present embodiment is a modified example in which a commonly connected position of the ground lines GL2 and GL4 is changed from the configuration of the fifth embodiment. Other elements are the same as those of the fifth embodiment, and therefore, description thereof will be omitted.

Figure 13:
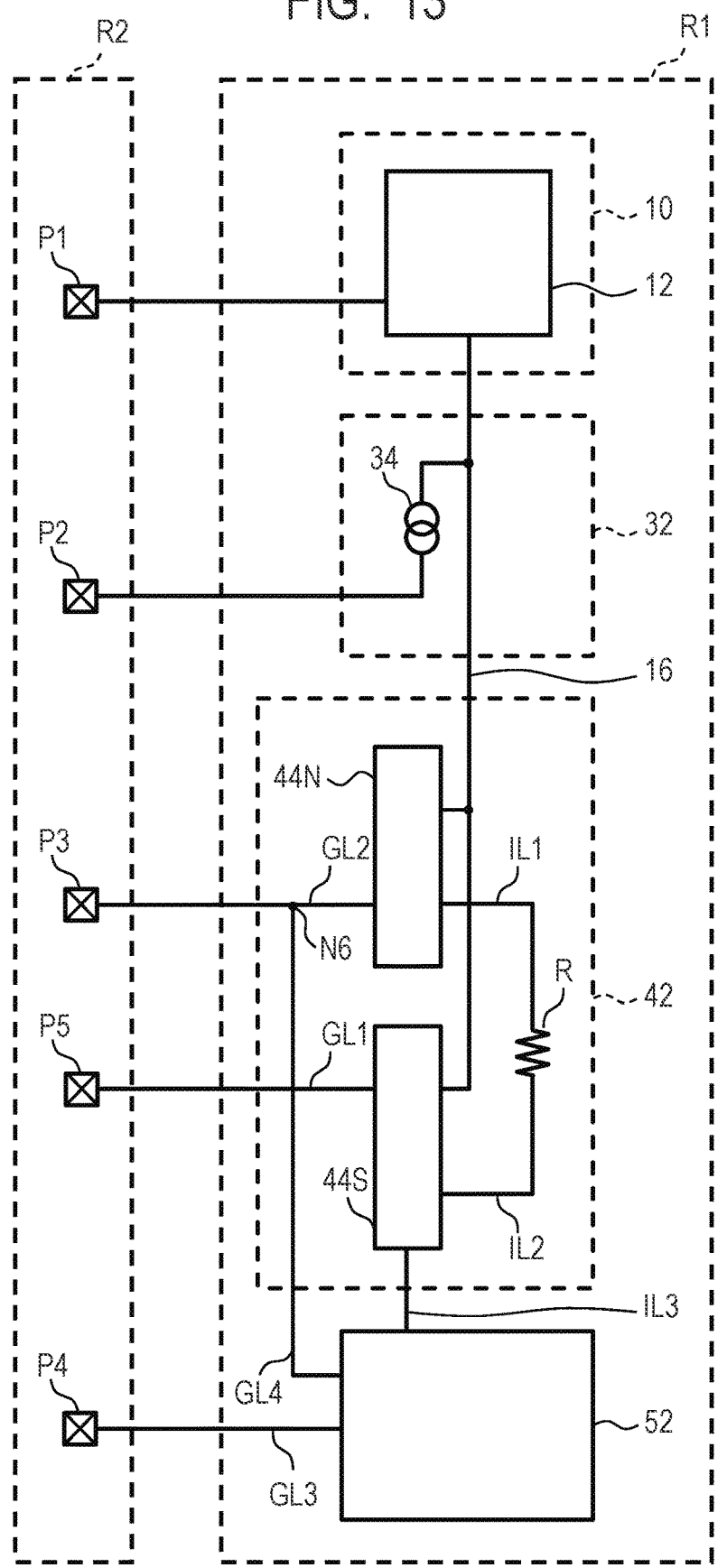
FIG. 13 is a block diagram illustrating a circuit configuration of one column and connection of wirings according to a sixth embodiment.

FIG. 13 is a block diagram illustrating the circuit configuration of one column and the connection of wirings according to the present embodiment. As illustrated in FIG. 13, the ground line GL2 and the ground line GL4 are commonly connected at a node N6 in the sample and hold unit 42. Although only one column is illustrated in FIG. 13, the node N6 at which the ground lines are commonly connected may be provided for each column circuit.

In the present embodiment, as in the fifth embodiment, the ground lines are not commonly connected outside the element region R1, but the common node N6 is provided for each column. Since the ground lines are commonly connected for each AD conversion unit, the effect of noise reduction may be further improved.

In the configuration of the fifth embodiment, the ground lines are commonly connected at the node N5 closer to the pad P3. Further, the node N5 may be commonly provided for a plurality of column circuits. In this configuration, common impedance caused by the line between the node N5 and the pad P3 may be reduced. Therefore, depending on the design, the configuration of the fifth embodiment may reduce noise. The configuration of the fifth embodiment and the configuration of the sixth embodiment may be appropriately selected in consideration of conditions such as circuit design and layout.

In FIG. 13, the ground line GL4 is commonly connected to the ground line GL2 at the node N6, and the ground line GL1 is separated from those ground lines. However, the ground line GL4 may be commonly connected to the ground line GL1, and the ground line GL2 may be separated from those ground lines.

Seventh Embodiment

The photoelectric conversion device 100 of the present embodiment is a modified example in which the configuration of the ground lines in the AD conversion circuit 52 is changed from the configuration of any of the third to sixth embodiments. Other elements are the same as those in the third to sixth embodiments, and thus description thereof will be omitted.

Figure 14:
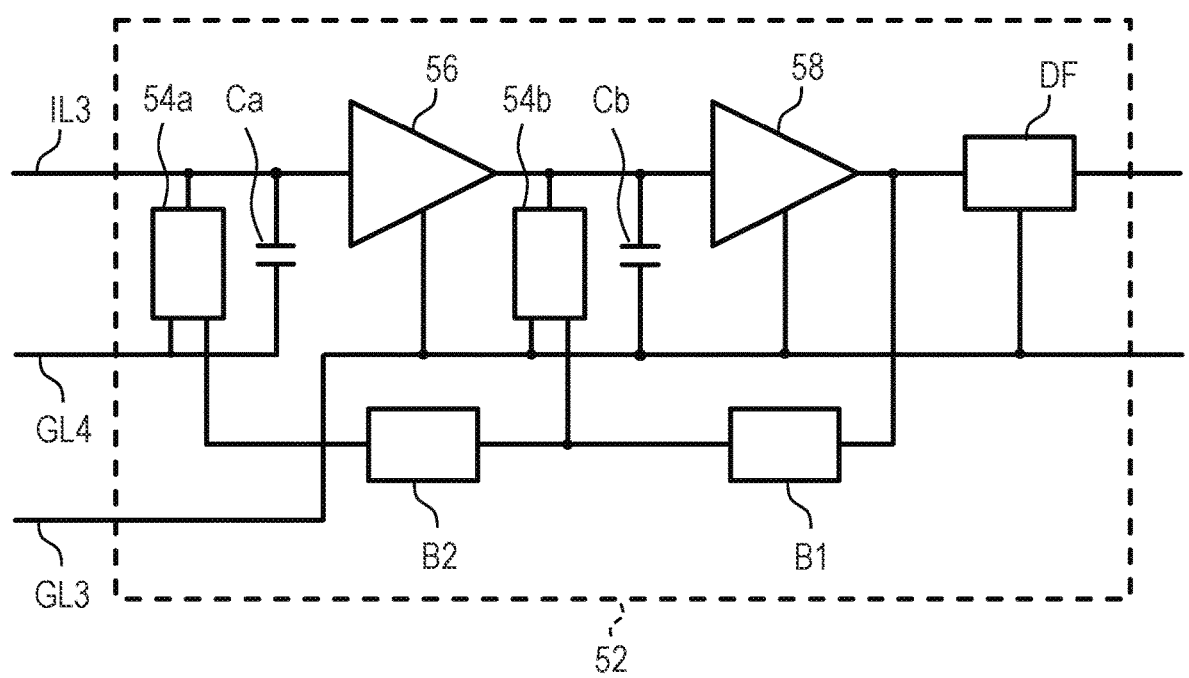
FIG. 14 is a block diagram illustrating a configuration of an AD conversion unit according to a seventh embodiment.

FIG. 14 is a block diagram illustrating a configuration of the AD conversion circuit 52 according to the present embodiment. As illustrated in FIG. 14, the ground terminal of the DA conversion circuit 54a and the second terminal of the capacitor Ca are connected to the ground line GL4. The ground terminal of the DA conversion circuit 54b, the second terminal of the capacitor Cb, the ground terminal of the voltage-to-current conversion unit 56, the ground terminal of the quantizer 58, and the ground terminal of the decimation filter DF are connected to the ground line GL3.

In the present embodiment, the ground line GL3 connected to a part where the AD conversion operation is performed, such as the quantizer 58, in the AD conversion circuit 52 is separated from the ground line GL4 of the DA conversion circuit 54a arranged at the input side of the AD conversion circuit 52 and the second terminal of the capacitor Ca. As a result, kickback in which fluctuations in potential that may be caused by the AD conversion operation affect the node on the input side may be reduced. Therefore, according to the present embodiment, the photoelectric conversion device 100 with improved accuracy is provided.

Although two examples of FIGS. 10 and 14 are illustrated as methods for separating the ground lines GL3 and GL4 in the AD conversion circuit 52, the method for separating the ground lines is not limited thereto. For example, the ground lines may be separated at a node between the ground terminal of the voltage-to-current conversion unit 56 and the ground terminal of the DA converter 54b. Further, the ground lines may be separated at a node between the ground terminal of the DA conversion circuit 54b and the second terminal of the capacitor Cb. Further, the ground lines may be separated at a node between the second terminal of the capacitor Cb and the ground terminal of the quantizer 58. As described above, if at least the ground terminal of the quantizer 58 and the ground terminal of an element at the preceding state are separated from each other, the effect of reducing kickback may be obtained.

Eighth Embodiment

The photoelectric conversion device 100 of the present embodiment is a more specific example of the arrangement of the sample and hold units 42 described in the first embodiment. The configuration of the sample and hold unit 42 described in the present embodiment can be applied to any of the first to seventh embodiments, and description of portions overlapping with those of the first to seventh embodiments will be omitted.

Figure 15:
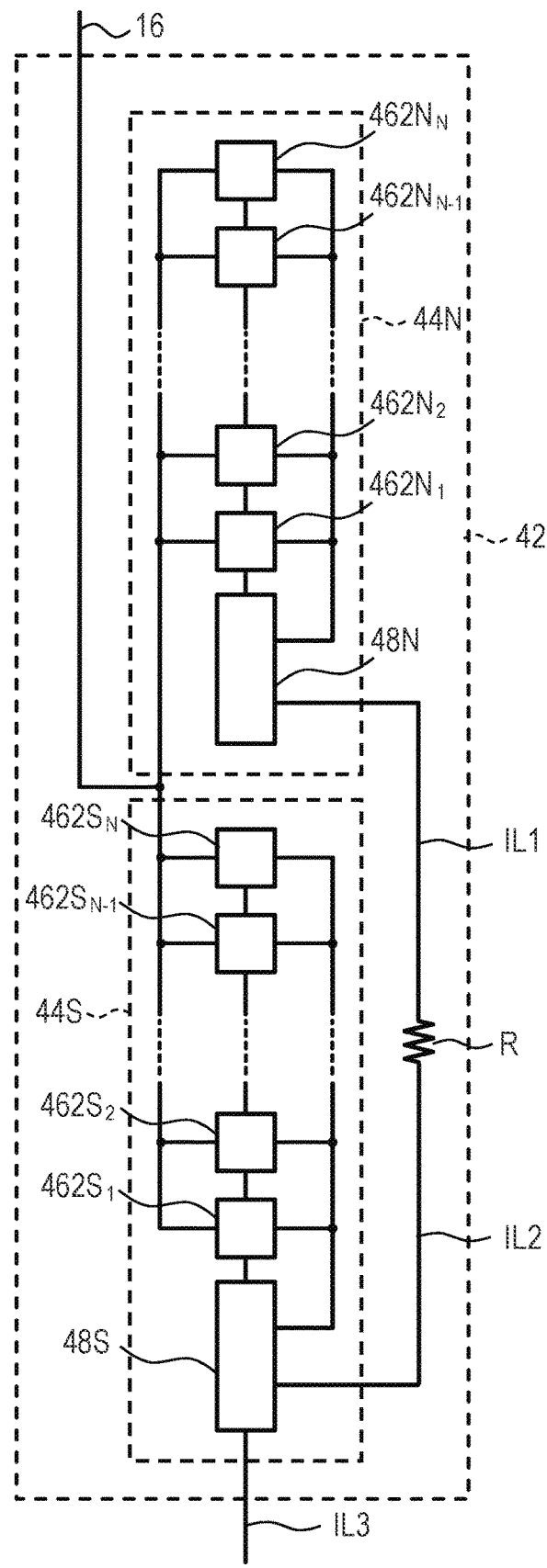
FIG. 15 is a block diagram illustrating an arrangement of a sample and hold unit according to an eighth embodiment.

FIG. 15 is a block diagram illustrating an arrangement of the sample and hold unit 42 according to the eighth embodiment. FIG. 15 schematically illustrates the arrangement of the sample and hold circuits $462N_1$ to $462N_N$, the amplifying unit 48N, the sample and hold circuits $462S_1$ to $462S_N$, and the amplifying unit 48S. The connection relationships of the respective portions are the same as those illustrated in FIGS. 5 and 6, and therefore the description thereof will be omitted. As illustrated in FIG. 15, the column signal line 16 and the signal lines ILL IL2, and IL3 extend in the first direction (vertical direction in FIG. 15). As illustrated in FIG. 15, the sample and hold circuits $462N_1$ to $462N_N$, the amplifying unit 48N, the sample and hold circuits $462S_1$ to $462S_N$, and the amplifying unit 48S also extend in the first direction in this order. By arranging each of the circuits and the signal lines in parallel in this manner, these elements can be efficiently laid out.

Ninth Embodiment

Figure 16:
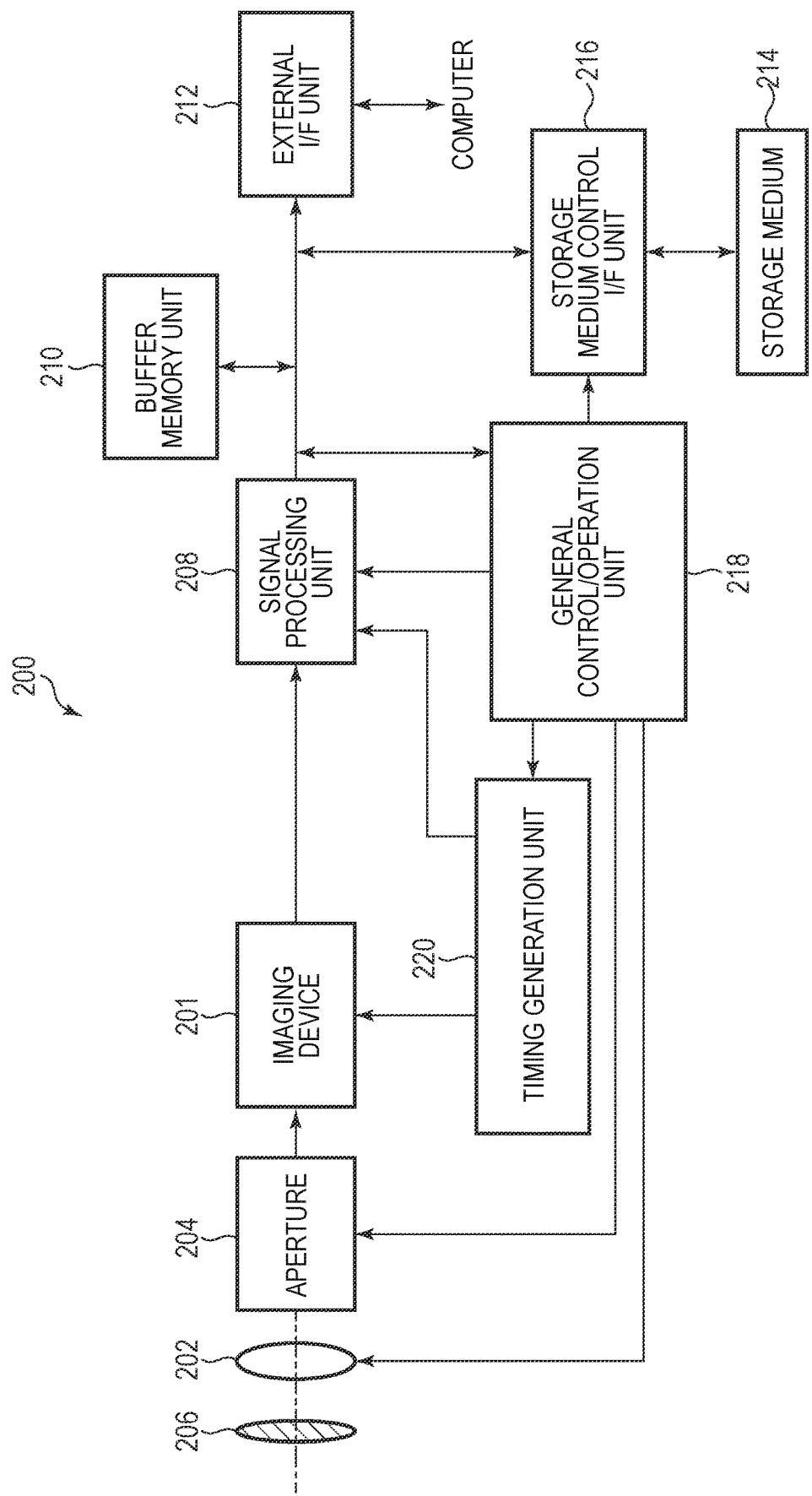
FIG. 16 is a block diagram illustrating a schematic configuration of an imaging system according to a ninth embodiment.

An imaging system according to a ninth embodiment of the present disclosure will be described with reference to FIG. 16. FIG. 16 is a block diagram illustrating a schematic configuration of an imaging system according to the present embodiment.

The photoelectric conversion device 100 described in the first to eighth embodiments is applicable to various photoelectric conversion systems. An example of the photoelectric conversion system is an imaging system. Examples of an imaging system to which the photoelectric conversion device 100 can be applied include a digital still camera, a digital camcorder, a surveillance camera, a copier, a fax machine, a cellular phone, an in-vehicle camera, and an observation satellite. A camera module including an optical system such as a lens and a photoelectric conversion device is also included in the imaging system. FIG. 16 illustrates a block diagram of a digital still camera as an example of them.

An imaging system 200 illustrated in FIG. 16 includes an imaging device 201, a lens 202 for forming an optical image of an object on the imaging device 201, an aperture 204 for varying the amount of light passing through the lens 202, and a barrier 206 for protecting the lens 202. The lens 202 and the aperture 204 are optical systems for focusing light on the imaging device 201. The imaging device 201 is the photoelectric conversion device 100 described in any of the first to eighth embodiments, and converts an optical image formed by the lens 202 into image data.

The imaging system 200 also includes a signal processing unit 208 that processes an output signal output from the imaging device 201. The signal processing unit 208 generates image data from the digital signal output from the imaging device 201. The signal processing unit 208 performs various types of correction and compression as necessary to output image data.

The imaging system 200 further includes a buffer memory unit 210 for temporarily storing image data, and an external interface unit (external I/F unit) 212 for communicating with an external computer or the like. The imaging system 200 further includes a storage medium 214 such as a semiconductor memory for storing or reading image data, and a storage medium control interface unit (storage medium control I/F unit) 216 for storing or reading image data on or from the storage medium 214. The storage medium 214 may be built in the imaging system 200 or may be detachable.

The imaging system 200 further includes a general control/operation unit 218 that controls various calculations and the entire digital still camera, and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes the output signal output from the imaging device 201.

The imaging device 201 outputs an image signal to the signal processing unit 208. The signal processing unit 208 performs predetermined signal processing on an image signal output from the imaging device 201, and outputs image data. The signal processing unit 208 generates an image using the image signal.

As described above, according to the present embodiment, an imaging system to which the photoelectric conversion device 100 according to the first to eighth embodiments is applied can be realized.

Tenth Embodiment

Figure 17A:
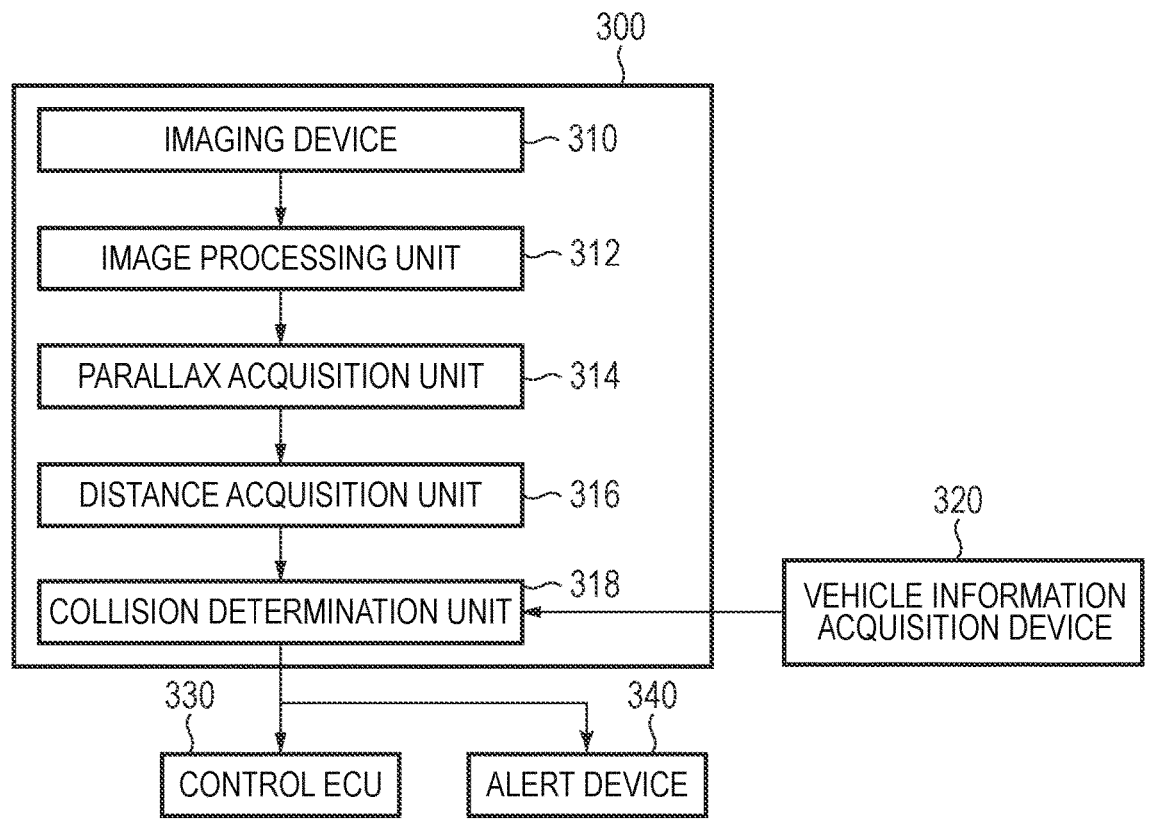
FIGS. 17A and 17B are diagrams illustrating a configuration example of an imaging system and a movable body according to a tenth embodiment.
Figure 17B:
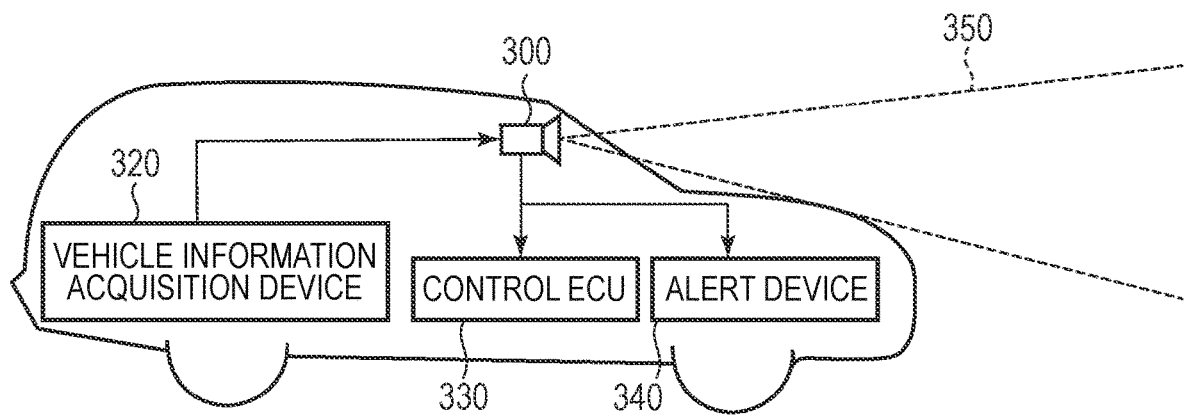

An imaging system and a movable body according to a tenth embodiment of the present disclosure will be described with reference to FIGS. 17A and 17B. FIGS. 17A and 17B are diagrams illustrating configurations of an imaging system and a movable body according to the present embodiment.

FIG. 17A illustrates an example of an imaging system related to an in-vehicle camera. The imaging system 300 includes an imaging device 310. The imaging device 310 is the photoelectric conversion device 100 according to any one of the first to eighth embodiments. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging system 300. The imaging system 300 also includes a distance acquisition unit 316 that calculates the distance to an object based on the calculated parallax, and a collision determination unit 318 that determines whether there is a possibility of collision based on the calculated distance. Here, the parallax acquisition unit 314 and the distance acquisition unit 316 are an example of a distance information acquisition means that acquires distance information to an object. That is, the distance information is information related to parallax, defocus amount, distance to an object, and the like. The collision determination unit 318 may determine the possibility of collision using any of the distance information. The distance information acquisition means may be realized by hardware designed exclusively, or may be realized by a software module. It may be realized by a field programmable gate array (FPGA), an application specific integrated circuit (ASIC), or the like, or may be realized by a combination thereof.

The imaging system 300 is connected to the vehicle information acquisition device 320, and can acquire vehicle information such as a vehicle speed, a yaw rate, and a steering angle. Further, the imaging system 300 is connected to a control ECU 330, which is a control device that outputs a control signal for generating braking force to the vehicle based on the determination result obtained by the collision determination unit 318. The imaging system 300 is also connected to an alert device 340 that issues an alert to the driver based on the determination result obtained by the collision determination unit 318. For example, when the collision possibility is high as the determination result of the collision determination unit 318, the control ECU 330 performs vehicle control to avoid collision or reduce damage by applying a brake, returning an accelerator, suppressing engine output, or the like. The alert device 340 provides a warning to the user by sounding an alarm such as a sound, displaying alert information on a screen of a car navigation system or the like, or applying vibration to a seatbelt or steering.

In the present embodiment, an image of the periphery of the vehicle, for example, the front or the rear, is captured by the imaging system 300. FIG. 17B illustrates an imaging system in the case of capturing an image of the front of the vehicle (imaging range 350). The vehicle information acquisition device 320 sends an instruction to the imaging system 300 or the imaging device 310. With such a configuration, the accuracy of distance measurement can be further improved.

Although an example of controlling the vehicle so as not to collide with another vehicle has been described above, the technique may be applied to a control for automatically driving following another vehicle or a control for automatically driving so as not to protrude from a lane. Further, the imaging system is not limited to a vehicle such as the own vehicle, but may be applied to a movable body (movable machinery) such as a ship, an aircraft, or an industrial robot. In addition, the technique may be applied not only to a movable body but also to an apparatus widely using object recognition, such as an intelligent transport system (ITS).

MODIFIED EMBODIMENTS

The disclosure is not limited to the above-described embodiments, and various modifications are possible. For example, an example in which a configuration of a part of one embodiment is added to another embodiment, or an example in which a configuration of a part of one embodiment is replaced with a configuration of a part of another embodiment is also an embodiment of the disclosure.

The imaging systems illustrated in the ninth and tenth embodiments are examples of imaging systems to which the photoelectric conversion device of the present disclosure can be applied, and the imaging systems to which the photoelectric conversion device of the present disclosure can be applied are not limited to the configurations illustrated in FIGS. 16, 17A, and 17B.

In the above-described embodiment, two types of examples are illustrated, that is, a first example in which a node in which a ground lines are commonly connected is provided corresponding to each of the column circuits and a second example in which the node is provided commonly to a plurality of column circuits are illustrated, but the disclosure is not limited to these. For example, if any two of the plurality of columns are referred to as a first column and a second column, the ground line in the first column may be commonly connected to the ground line in the second column. Here, the first column and the second column may be adjacent columns or may be non-adjacent columns Examples of the non-adjacent columns include a case where both the first column and the second column are even-numbered columns, or a case where both the first column and the second column are odd-numbered columns. As another example, the first column and the second column may be columns in which color filters of the same color are arranged in the pixels 12. As yet another example, in a configuration in which column circuits extend in both vertical directions from the pixel array 10, the first column and the second column may be columns arranged in different vertical directions.

In the above-described embodiments, various examples in which the ground lines for supplying the ground potential are commonly connected or separated are illustrated, but the disclosure is not limited thereto. For example, in a manner similar to the above-described ground lines, power supply lines for supplying a power supply potential may be commonly connected or separated, and a reference potential lines for supplying a reference potential may be commonly connected or separated. In these examples, the same effect can be obtained. The ground lines, the power supply lines, and the reference potential lines are sometimes referred to as potential lines more generally.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-016618, filed Feb. 4, 2021, which is hereby incorporated by reference herein in its entirety.

What is claimed is:

1. A photoelectric conversion device comprising:
a pixel array including a plurality of pixels arranged to form a plurality of columns and each configured to generate a first signal based on incident light and a second signal based on a reset state; and
a column circuit arranged corresponding to each of the plurality of columns of the pixel array,
wherein the column circuit includes:
  a first sample and hold unit configured to hold the first signal;
  a second sample and hold unit configured to hold the second signal;
  a delta-sigma analog-to-digital conversion circuit configured to convert an analog signal based on outputs from the first sample and hold unit and the second sample and hold unit into a digital signal;
  a first line configured to supply a potential to the first sample and hold unit; and
  a second line configured to supply a potential to the second sample and hold unit, and
wherein the first line and the second line are connected in common, in the photoelectric conversion device.

2. The photoelectric conversion device according to claim 1,
wherein the first sample and hold unit includes a first amplifier and a first source follower circuit that are cascade-connected,
wherein the second sample and hold unit includes a second amplifier and a second source follower circuit that are cascade-connected,
wherein the first line supplies a potential to at least one of the first amplifier and the first source follower circuit, and
wherein the second line supplies a potential to at least one of the second amplifier and the second source follower circuit.

3. The photoelectric conversion device according to claim 1, wherein the analog signal is a signal based on a difference between the first signal and the second signal.

4. The photoelectric conversion device according to claim 1 further comprising a common external terminal for supplying a common potential to the first line and the second line.

5. The photoelectric conversion device according to claim 1, wherein a node at which the first line and the second line are connected in common is provided corresponding to each of the plurality of column circuits.

6. The photoelectric conversion device according to claim 1, wherein a node at which the first line and the second line are connected in common is provided in common for the plurality of column circuits.

7. The photoelectric conversion device according to claim 1, wherein the first line and the second line included in the column circuit of a first column of the plurality of columns are connected in common to the first line and the second line included in the column circuit of a second column of the plurality of columns.

8. The photoelectric conversion device according to claim 1, wherein the potential is any one of a power supply potential, a ground potential, and a reference potential.

9. A photoelectric conversion system comprising:
the photoelectric conversion device according to claim 1; and
a signal processing unit configured to process a signal output from the photoelectric conversion device.

10. A movable body comprising:
the photoelectric conversion device according to claim 1;
a distance information acquisition unit configured to acquire distance information on a distance to an object, from a parallax image based on signals from the photoelectric conversion device; and
a control unit configured to control the movable body based on the distance information.

11. A photoelectric conversion device comprising:
a pixel array including a plurality of pixels arranged to form a plurality of columns and each configured to generate a first signal based on incident light and a second signal based on a reset state; and
a column circuit arranged corresponding to each of the plurality of columns of the pixel array,
wherein the column circuit includes:
  a first sample and hold unit including a first amplifier and a first source follower circuit that are cascade-connected and configured to hold the first signal;

a second sample and hold unit including a second amplifier and a second source follower circuit that are cascade-connected and configured to hold the second signal;

a first line configured to supply a driving potential to at least one of the first amplifier and the first source follower circuit; and a second line configured to supply a driving potential to at least one of the second amplifier and the second source follower circuit, and wherein the first line and the second line are connected in common, in the photoelectric conversion device.

12. A photoelectric conversion system comprising:

the photoelectric conversion device according to claim 4; and a signal processing unit configured to process a signal output from the photoelectric conversion device.

13. A movable body comprising:

the photoelectric conversion device according to claim 4;

a distance information acquisition unit configured to acquire distance information on a distance to an object, from a parallax image based on signals from the photoelectric conversion device; and a control unit configured to control the movable body based on the distance information.

* * * * *